United States Patent
Gach (10) Patent No.: US 9,482,578 B2
(45) Date of Patent: Nov. 1, 2016

(54) SPECTRAL SENSITIVE SOLID-STATE PHOTODETECTOR

(75) Inventor: Jean-Luc Gach, Peynier (FR)

(73) Assignee: Universite d'Aix-Marseille, Marseilles (FR)

( * ) Notice: Subject to any disclaimer, the term of this patent is extended or adjusted under 35 U.S.C. 154(b) by 416 days.

(21) Appl. No.: 13/994,392

(22) PCT Filed: Dec. 13, 2011

(86) PCT No.: PCT/EP2011/072618
§ 371 (c)(1),
(2), (4) Date: Aug. 23, 2013

(87) PCT Pub. No.: WO2012/080256
PCT Pub. Date: Jun. 21, 2012

(65) Prior Publication Data
US 2013/0335742 A1 Dec. 19, 2013

(30) Foreign Application Priority Data

Dec. 14, 2010 (FR) ..................... 10 04866

(51) Int. Cl.
*G01J 3/50* (2006.01)
*H01L 27/146* (2006.01)
(Continued)

(52) U.S. Cl.
CPC .......... *G01J 3/505* (2013.01); *H01L 27/14647* (2013.01); *H01L 31/02027* (2013.01); *H01L 31/107* (2013.01); *H04N 5/33* (2013.01)

(58) Field of Classification Search
CPC .......... H01L 31/107; H01L 31/02027; H01L 27/14647; G01J 3/505

USPC .......... 250/214.1, 208.1, 338.1; 257/438, 186
See application file for complete search history.

(56) References Cited

U.S. PATENT DOCUMENTS 5,719,414 A * 2/1998 Sato et al. .................... 257/186
5,782,756 A * 7/1998 Mannheimer ................. 600/322
(Continued)

FOREIGN PATENT DOCUMENTS

JP 2008-241578 A 10/2008

OTHER PUBLICATIONS

Turner, 2006, "Interaction of Ionizing Radiation with Matter" in 50th Anniversary of the Health Physics Society—A Half Century of Health Physics, Lippincott Williams & Wilkins, p. 17.*
(Continued)

*Primary Examiner* — David Porta
*Assistant Examiner* — Blake Riddick
(74) *Attorney, Agent, or Firm* — Panitch Schwarze Belisario & Nadel LLP (57) ABSTRACT

A method for detecting photons includes subjecting a photodiode formed in a semi-conductive material, to a bias voltage such that an avalanche phenomenon can appear when a photon enters the photodiode in an avalanche layer extending into the semi-conductive material down to minimum and maximum depths so that it can be reached by photons having a wavelength between minimum and maximum wavelengths. The method also includes comparing the amplitude of a signal supplied by the photodiode with two threshold values, and deducing that the photodiode received a photon having a wavelength between two threshold wavelengths ranging between the minimum and maximum wavelengths, if the amplitude of the signal is between the two threshold values.

28 Claims, 6 Drawing Sheets (51) Int. Cl.
  *H01L 31/02*     (2006.01)
  *H01L 31/107*    (2006.01)
  *H04N 5/33*      (2006.01)

(56) References Cited

U.S. PATENT DOCUMENTS

| | | | | |
|---|---|---|---|---|
| 5,965,875 A * | 10/1999 | Merrill | ............ | 250/226 |
| 2002/0018290 A1* | 2/2002 | Birk et al. | ............ | 359/368 |
| 2005/0205930 A1* | 9/2005 | Williams, Jr. | ............ | 257/347 |
| 2006/0231913 A1* | 10/2006 | Wilsey et al. | ............ | 257/461 |
| 2006/0292728 A1* | 12/2006 | Ishibashi et al. | ............ | 438/30 |
| 2010/0316184 A1* | 12/2010 | Iwanczyk et al. | ............ | 378/19 |

OTHER PUBLICATIONS

Zimmermann, 2010, "Integrated Silicon Optoelectronics", Springer, chapter 1, pp. 1-9.*
Int'l Preliminary Report on Patentability issued Jun. 18, 2013 in Int'l Application No. PCT/EP2011/072618.
Int'l Search Report and Written Opinion issued Mar. 28, 2013 in Int'l Application No. PCT/EP2011/072618.
Kirn et al, "Wavelength dependence of avalanche photodiode (APD) parameters," Nuclear Instruments & Methods in Physics Research. Section A: Accelerators, Spectrometers, Detectors, and Associated Equipment, vol. 387, No. 1, pp. 202-204 (Mar. 1, 1997).

* cited by examiner

SPECTRAL SENSITIVE SOLID-STATE PHOTODETECTOR

CROSS-REFERENCE TO RELATED APPLICATIONS

This application is a Section 371 of International Application No. PCT/EP2011/072618, filed Dec. 13, 2013, which was published in the French language on Jun. 21, 2012, under International Publication No. WO 2012/080256 A2 and the disclosure of which is incorporated herein by reference.

BACKGROUND OF THE INVENTION

The present invention relates to the field of photodetectors and in particular those used to capture images in different ranges of wavelengths. Photodetectors can thus be disposed according to a matrix configuration to produce an imager.

This invention applies particularly to imaging in the infrared range, and in particular to night vision, earth observation and astronomy.

Present-day photodetectors do not generally provide information about the wavelength of the photons they detect. To obtain such information, one well-known method however involves associating a filter with the photodetector, which restricts the sensitivity of the photodetector to a smaller range of wavelengths. One well-known method involves using in the imagers either a global filter covering all the pixels of the imager and limiting the sensitivity of all the pixels to a same range of wavelengths, or a filter having a color distribution enabling images to be generated in color. Mass-produced color imagers of CCD or CMOS type are thus currently associated with a matrix of filters of Bayer type associating a red, green or blue filter with each pixel of the imager.

The U.S. Pat. No. 5,965,875 describes a photodetector using the intrinsic capacities of semi-conductive materials to let photons penetrate down to a depth depending on the wavelength of the photon, where an electron-hole pair is generated. For this purpose, the photodetector described in this document includes a multi-layer structure, each layer of which has undergone a different doping treatment and is associated with a respective detector circuit. Each detector circuit thus supplies a signal representative of the quantity of photons received by the photodetector in a certain wavelength range.

These photodetectors have the disadvantage of not determining the wavelength of an incident photon, but of working by rejection using filters or by using the intrinsic properties of materials. In an imager, the photons reaching a photodetector, but not belonging to a given range of wavelengths corresponding to the bandwidth of the filter or of the material encountered, are not used to form an image, even though they would be detected by a neighboring photodetector. The light sensitivity of such an imager is thus reduced. This sensitivity is also reduced by the presence of non-transparent structures (oxides, polysilicon, metallizations) covering a considerable portion of the sensitive surface of the imagers. Furthermore, the imagers implementing a matrix of filters with different colors have a spatial resolution equal to the number of pixels of the imager divided by the number of ranges of wavelengths to be discriminated. The result is that the number of ranges of wavelengths discriminated in an imager is generally limited to 2 or 3.

It is thus desirable to produce a photodetector enabling, using a single-pixel structure, the wavelength of an incident photon to be detected. It is also desirable to produce an imager including such a photodetector.

BRIEF SUMMARY OF THE INVENTION

One embodiment is based on the use of an avalanche photodiode. The avalanche effect can occur in a semi-conductive material when the latter is subjected to an electric field sufficiently intense to speed up the free electrons and give them sufficient energy for other electrons to be released by striking atoms in an avalanche zone. The number of free electrons in the material can thus increase rapidly as the new free electrons cause the release of other electrons in the avalanche zone. The presence of a free electron in a semi-conductive material can result from the interaction of the material with a photon. The avalanche zone can then generate several tens or even hundreds of free electrons, thus creating an amplified electric signal triggered by the appearance of a photon. The avalanche zone is physically localized in a semi-conductive material at the junction between two zones having different doping treatments. The thickness of the avalanche zone which can reach one to several micrometers, depends on the nature of the semi-conductive material and on the intensity of the electric field to which it is subjected, resulting from the application of a reverse bias voltage.

Some embodiments relate to a method for detecting photons, including a step of subjecting a photodiode formed in a semi-conductive material to a bias voltage such that an avalanche phenomenon is triggered in an avalanche layer of the photodiode when a photon enters the photodiode. According to one embodiment, the avalanche layer extends into the semi-conductive material down to minimum and maximum depths so that it can be reached by photons having a wavelength between minimum and maximum wavelengths, the method including steps of comparing the amplitude of a signal supplied by the photodiode with two different threshold values, and of deducing that the photodiode has received a photon having a wavelength between two threshold wavelengths ranging between the minimum and maximum wavelengths, if the amplitude of the signal is between the two threshold values.

According to one embodiment, the method includes steps of counting during an acquisition period a number of pulses detected at the terminals of the photodiode, having an amplitude between the two threshold values to obtain a value representative of a number of photons that have entered the photodiode during the acquisition period, and having a wavelength between the two threshold wavelengths.

According to one embodiment, the method includes steps of counting during an acquisition period a number of pulses detected at the terminals of the photodiode, having an amplitude greater than the highest of the two threshold values to obtain a value representative of a number of photons that have entered the photodiode during the acquisition period, and having a wavelength below the lowest of the two threshold wavelengths.

According to one embodiment, the lowest of the two threshold values corresponds to an extreme photon wavelength to be detected.

According to one embodiment, the method includes steps of comparing the amplitude of the signal supplied by the photodiode with several other threshold values, so as to delimit with the two threshold values several ranges of amplitude values, and of counting during an acquisition period numbers of pulses of the signal in each of the ranges of amplitude values.

According to one embodiment, ranges of pulse amplitude values delimited by the threshold values are not contiguous and/or overlap.

According to one embodiment, the method includes a step of adjusting the threshold values to adjust ranges of wavelengths in which photons are to be detected.

According to one embodiment, the method includes a step of adjusting the bias voltage of the photodiode so that all the photons to be detected can reach the avalanche layer without going beyond it.

Some embodiments also relate to a device for detecting photons, including a photodiode formed in a semi-conductive material, and subjected to a bias voltage such that an avalanche phenomenon is triggered in an avalanche layer of the photodiode when a photon enters the photodiode. According to one embodiment, the avalanche layer extends into the semi-conductive material down to minimum and maximum depths so that it can be reached by photons having a wavelength between minimum and maximum wavelengths, the device being configured to implement the method defined above.

According to one embodiment, the photodiode includes a low-doped or undoped collection layer with a reduced thickness so that the avalanche layer can extend at least down to a depth reached by photons having an extreme wavelength to be detected.

According to one embodiment, the photodiode includes a junction pn made at a certain depth in the semi-conductive material, the semi-conductive material and the depth of the junction pn being chosen so that the semi-conductive material can be passed through by photons to be detected down to a depth likely to be located in the avalanche layer of the photodiode.

Some embodiments also relate to an imager, including several detection devices as defined above, the photodiodes of the detection devices being disposed according to a matrix configuration.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
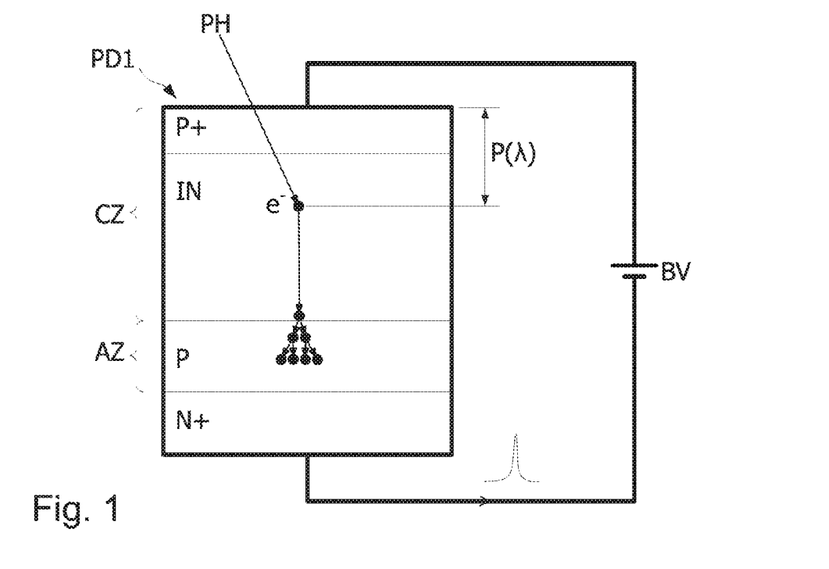
FIG. 1 schematically represents an avalanche photodiode reverse-biased by a direct voltage source, to produce an avalanche effect.

FIG. 1 represents an avalanche photodiode PD1 made in a semi-conductive material including several different doping layers. Thus, the photodiode PD1 includes an N+-doped deep layer, a so-called P-doped "avalanche" layer AZ formed above the deep layer, a slightly N-doped intermediate layer IN or doped in an intrinsic semiconductor and a P+-doped surface layer. The semi-conductive material is reverse-biased by a direct voltage source BV producing an electric field between the deep layer and the surface layer, enabling the electrons of the surface layer to be accelerated towards the deep layer. The bias voltage is sufficient to accelerate the free electrons of the semi-conductive material and give them sufficient energy for other electrons to be released by striking atoms of the material. The number of free electrons can thus increase rapidly as, in turn, the new free electrons will strike atoms and release other electrons.

When an incident photon PH penetrates the semi-conductive material down to a depth $P(\lambda)$ in a so-called "collection" layer CZ made up of the surface and intermediate layers IN, it releases an electron $e^-$. This electron is accelerated by the electric field down to the avalanche layer AZ. In the avalanche layer, the electric field is such that it gives the free electron a speed capable of releasing other electrons which, in turn, release other electrons. When the released electrons reach the N+ deep layer, the first electron released by the photon PH is multiplied by a factor G. The avalanche phenomenon is thus similar to a gain signal amplifier equal to G. The released electrons are evacuated towards the bias voltage source BV and generate, as they move, a pulse of current referred to as "photoelectric current".

The thickness of the avalanche layer AZ depends on the selected material, on the depth at which a junction pn is formed in the semi-conductive material and on the reverse bias voltage of the photodiode. This thickness can thus reach several micrometers with a high reverse bias voltage. However, the bias voltage must not exceed a breakdown voltage of the photodiode beyond which the photodiode can undergo an irreversible alteration. The breakdown voltage of a diode also depends on the nature of the semi-conductive material in which the diode is produced.

Figure 2A:
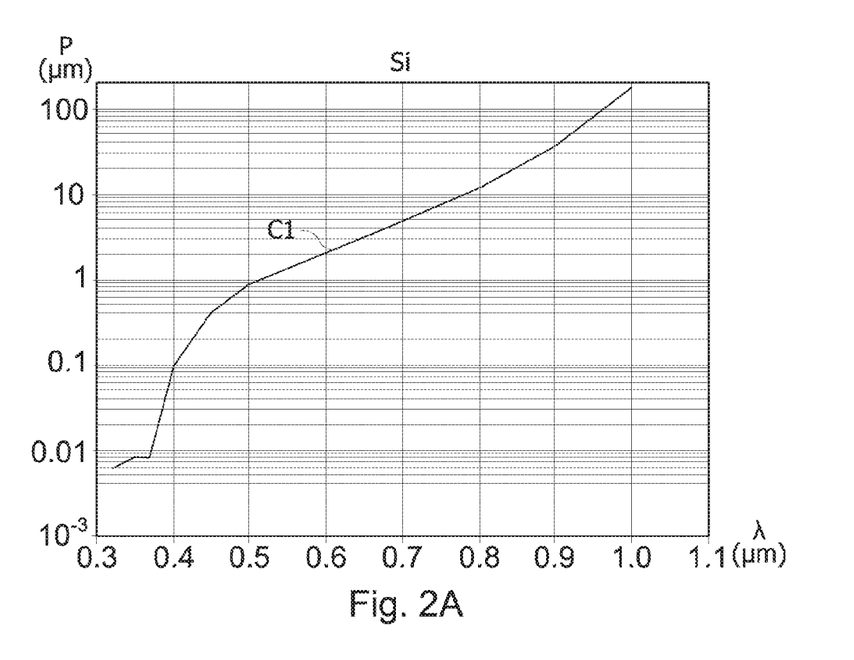
FIGS. 2A and 2B represent variation curves of the penetration depth of a photon in two different semi-conductive materials, according to the wavelength of the photon, FIGS. 3A and 3B schematically represent a photodiode according to one embodiment, in which incident photons having different wavelengths trigger an avalanche phenomenon.
Figure 2B:
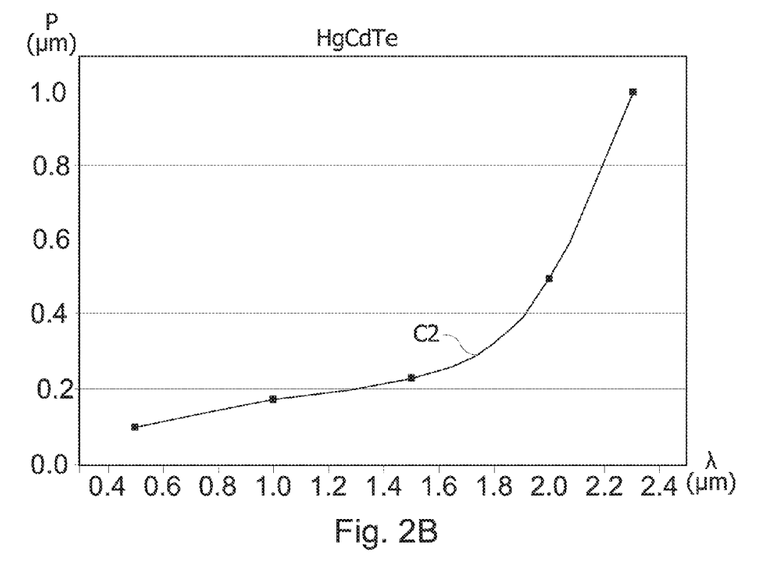

A photon can enter a semi-conductive material more or less deeply depending on its wavelength and the nature of the material, before interacting with the latter by creating an electron-hole pair. FIGS. 2A, 2B represent variation curves C1, C2 of the penetration depth P of a photon in a semi-conductive material according to the wavelength λ of the photon. The semi-conductive material is silicon in FIG. 2A, and cadmium and mercury telluride ($Hg_{1-x}Cd_xTe$ with x=0.45) in FIG. 2B. The curves C1, C2 show in particular that at wavelength values λ in excess of 0.37 μm for silicon and in excess of about 2 μm for $Hg_{0.55}Cd_{0.45}Te$, the penetration depth P of a photon rapidly increases with the wavelength.

Figure 3A:
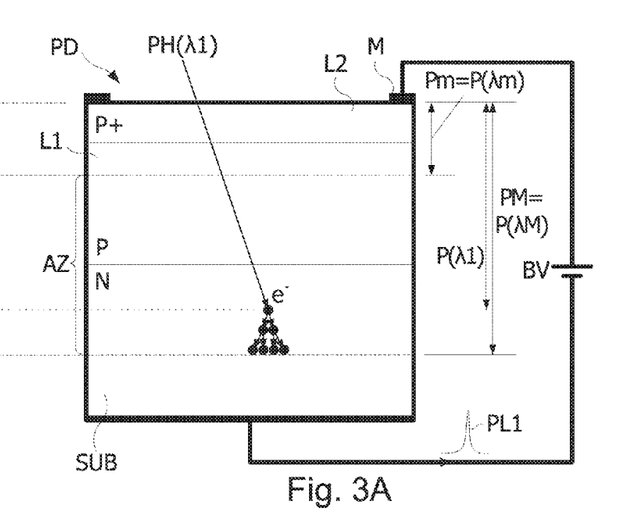
Figure 3B:
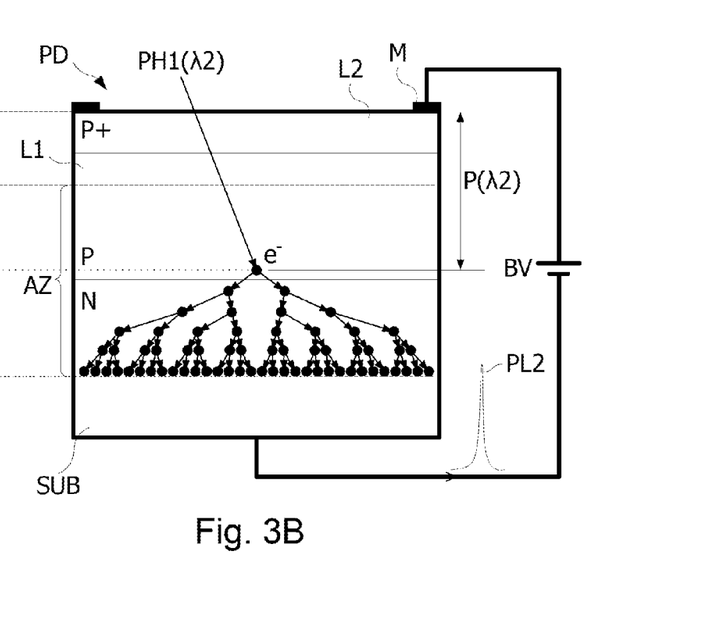

FIGS. 3A and 3B represent a photodiode PD according to one embodiment. Compared to the photodiode PD1 represented in FIG. 1, the photodiode PD does not include any collection layer or otherwise this layer has a thickness reduced to a minimum value. In the example of FIGS. 3A, 3B, the photodiode is formed in a substrate SUB of N type and includes a P-doped layer L1 on which a P+-doped layer L2 is formed. The layer L2 enables the photodiode to be connected to a connection metallization M (for example surrounding a sensitive face, receiving the photons, of the photodiode) forming the cathode of the photodiode. The anode of the photodiode is formed by a bulk (not represented) in contact with the substrate SUB. Naturally, other structures of photodiodes may be suitable.

The avalanche layer AZ extends on either side of the junction PN, from a minimum depth Pm reached by a photon having a wavelength lower than or equal to a minimum wavelength λm, down to a maximum depth PM reached by a photon having a wavelength higher than or equal to a maximum wavelength λM. The avalanche layer AZ thus appears from a depth Pm and extends over a thickness PM–Pm corresponding to the maximum range of wavelengths [λm, λM] of the photons to be detected. The thickness of the layer AZ depends on the reverse bias voltage BV of the photodiode.

In FIG. 3A, an incident photon PH with a wavelength λ1 (belonging to [λm, λM]) creates, in the avalanche layer AZ at a depth P(λ1), an electron-hole pair which, due to the avalanche phenomenon, generates free electrons the number of which depends on the gap between the depths P(λ1) and PM. In FIG. 3B, an incident photon PH1 of wavelength λ2 (between λm and λ1) penetrates the avalanche layer AZ down to a depth P(λ2) between the depths Pm and P(λ1). The result is that the avalanche phenomenon propagates into a more extended zone (between P(λ2) and PM) and thus the number of free electrons generated by the photon PH1 is higher than the one generated by the photon PH in FIG. 3A. As a result, the photon PH1 generates a pulse of current PL2 of amplitude greater than the one PL1 generated by the photon PH. The number of charges collected thus increases when the penetration depth of the photon decreases and thus when the wavelength of the latter decreases. Therefore, after receiving a photon, the photodiode PD generates a signal with a gain which increases when the wavelength of the incident photon decreases.

The amplitude I of the pulse of current PL1, PL2 generated by the photodiode PD after receiving an incident photon can be modeled by the following simplified theoretical formula (which does not take into account any non-linearities):

$$\begin{cases} I = ke(G+1) & \text{for } P(\lambda) < Pm \\ I = ke\left[\left(1 - \dfrac{P(\lambda) - Pm}{PM - Pm}\right)G + 1\right] & \text{for } Pm < P(\lambda) < PM \\ I = ke & \text{for } P(\lambda) > PM \end{cases} \quad (1)$$

in which e represents the electric charge of an electron, i.e. $1.602 \cdot 10^{-19}$ C, P(λ) is the penetration depth of the photon in the photodiode, varying according to the wavelength λ of the latter, G is the maximum gain of the photodiode obtained with a photon generating an electron-hole pair in the vicinity of the upper limit of the avalanche layer AZ (P(λ) near Pm), and k is a factor depending on the response time of the diode (depends on the diode construction). The result is that a photon having a wavelength lower than or equal to the minimum wavelength λm generates at the terminals of the photodiode a pulse of current of amplitude k·e(G+1), and that a photon having a wavelength greater than or equal to the maximum wavelength λM generates a pulse of current of amplitude equal to k·e. The gain G can reach one or several thousand in a silicon substrate and one to several hundred in a substrate made of cadmium and mercury telluride.

Figure 4A:
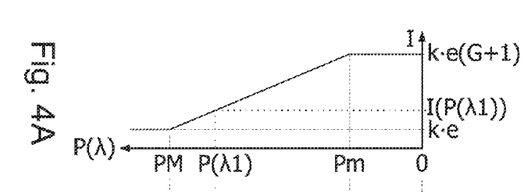
FIGS. 4A and 4B represent a variation curve of the amplitude of a pulse of current generated by a photon entering the photodiode according to the penetration depth of the photon in the photodiode.
Figure 4B:
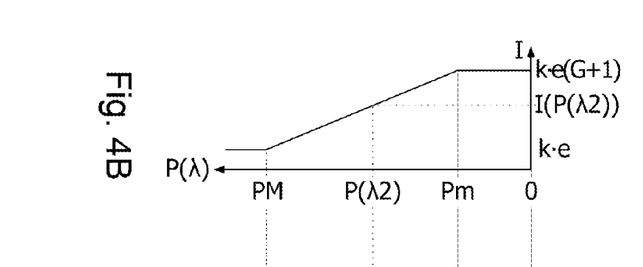

FIGS. 4A and 4B represent a variation curve of the amplitude I of a pulse of current generated by a photon according to the penetration depth P(λ) of the photon in the photodiode PD, in accordance with the formula (1). This curve shows that in the avalanche layer AZ (delimited by the depths Pm and PM), the amplitude I linearly decreases with the penetration depth of the photon in the photodiode. This property is used in one embodiment to discriminate the photons penetrating the photodiode according to their wavelength. In FIG. 4A, the photon PH having a wavelength λ1 which reaches a depth P(λ1) in the avalanche layer AZ, generates a pulse of current of amplitude I(P(λ1)) between k·e and k·e(G+1). In FIG. 4B, the photon PH1 having a wavelength λ2 which reaches a depth P(λ2) in the avalanche layer AZ, generates a pulse of current of amplitude I(P(λ2)) between I(P(λ1)) and k·e(G+1) since the depth P(λ2) is smaller than the depth P(λ1).

Figure 5:
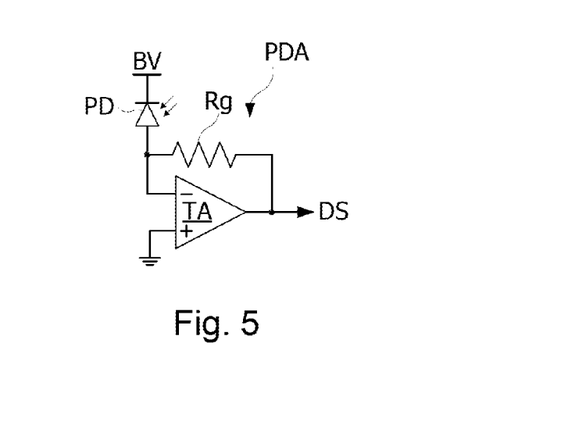
FIG. 5 is a wiring diagram of a circuit for generating a detection signal from an electric current resulting from the avalanche phenomenon in the photodiode, according to one embodiment.

FIG. 5 represents a circuit PDA enabling the signal supplied by the photodiode PD to be used. In the circuit PDA, the photodiode PD is associated with a transimpedance amplifier whose function is to convert the pulses of current P1, P2 produced by the photodiode into pulses of voltage. The photodiode PD receives on its cathode the bias voltage BV. The anode of the photodiode is connected to an inverting input of a differential amplifier TA mounted as a negative-feedback differential amplifier. For this purpose, the direct input of the amplifier TA is connected to the ground, and the output of the amplifier TA is linked through a resistor Rg to the inverting input of the amplifier. The amplifier TA supplies an output signal DS including a pulse of voltage every time the photodiode PD supplies a pulse of current. The circuit PDA has a gain given by the value of the resistor Rg and the voltage V of the signal DS can be calculated in the following manner:

$$V = RgI \quad (2)$$

in which I is the current passing through the photodiode PD.

Figure 5A:
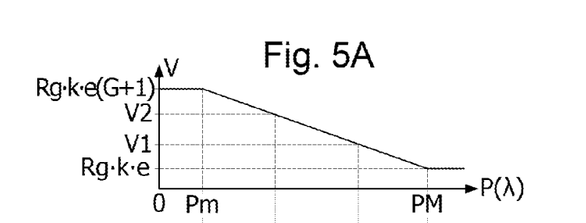
FIG. 5A represents a variation curve of the voltage amplitude of a pulse appearing in the output signal of the circuit in FIG. 5, following the penetration of a photon in the photodiode, according to the penetration depth of the photon in the photodiode.

FIG. 5A represents a variation curve of the amplitude of a pulse of the signal DS generated when a photon enters the photodiode PD, according to the penetration depth P of the photon in the photodiode, in accordance with the formulas (1) and (2). The curve in FIG. 5A shows that in the avalanche layer AZ (delimited by the depths Pm and PM), the voltage of a pulse generated by a photon decreases with the penetration depth P of the photon. Furthermore, a photon having a wavelength lower than or equal to the minimum wavelength λm generates in the signal DS a voltage pulse of amplitude Rg·k·e(G+1), and a photon having a wavelength greater than or equal to the maximum wavelength λM generates a voltage pulse of amplitude equal to Rg·k·e. The result is that the signal DS does not enable wavelengths of photons lower than the minimum wavelength λm and greater than the maximum wavelength λM to be discriminated.

As a result, if it is desirable to detect photons in a certain range of wavelengths, the photodiode can be selected or adapted so that all the photons to be detected can reach the avalanche layer without going beyond it, with a reverse bias voltage acceptable for the photodiode. In other words, the photodiode can be configured so that its avalanche layer can include a range of penetration depths in the photodiode of photons to be detected, this range of depths corresponding to the range of wavelengths of these photons. For this purpose, the thickness of the undoped or slightly doped layer INT (which can be omitted) of the collection layer CZ can be such that the upper limit of the avalanche layer can be reached by photons having the smallest wavelength to be detected. Similarly, the lower limit of the avalanche layer can be located at a depth greater than the depth reached by photons having the greatest wavelength to be detected. The positioning of the lower limit of the avalanche layer is linked to the choice of the semi-conductive material constituting the photodiode and to the depth of the junction pn in the photodiode. The choice of the semi-conductive material constituting the photodiode also determines the penetration depths of the photons according to their wavelength in the material. This choice thus impacts the wavelength selectivity of the photodiode which can be defined by the ratio between a difference in the depths reached by photons (substantially proportional to a difference in voltages measured), and a difference in the wavelengths of these photons.

It shall be noted that the photodiode can receive the photons on the substrate N side rather than on the N+-doped layer side, i.e. the photons enter the diode via the substrate before reaching the P-doped layer. In this case, the amplitude of the signal is inverted, the voltage of a pulse generated by a photon increasing with the penetration depth P of the photon, and thus with the wavelength of the latter.

Figure 5B:
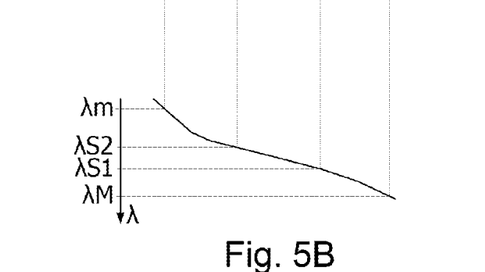
FIG. 5B represents a variation curve of the penetration depth of a photon in the photodiode according to the wavelength of the photon.

FIG. 5B represents a variation curve of the penetration depth of a photon in the semi-conductive material constituting the photodiode PD, according to the wavelength of the photon. It shall be noted that this curve essentially depends on the nature of the semi-conductive material. The curve in FIG. 5B is matched with the curve in FIG. 5A, such that the combination of these two curves shows that a photon wavelength in the range [λm, λM] corresponds to a single pulse voltage appearing in the signal DS at output of the circuit PDA, and vice versa.

Figure 6:
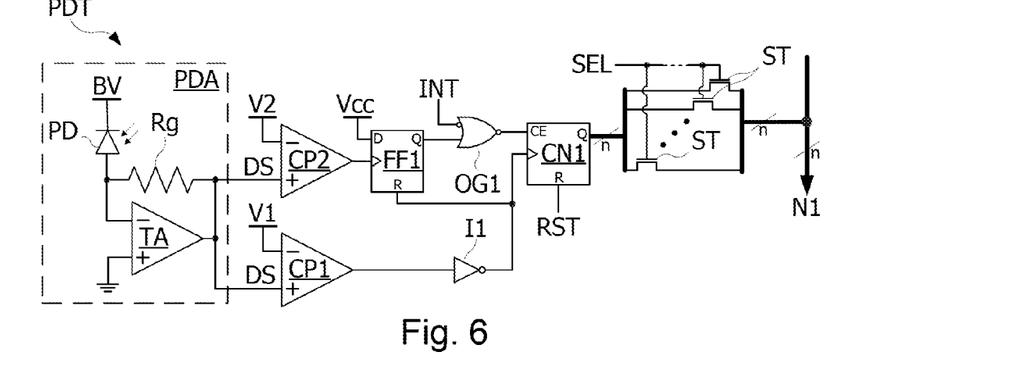
FIG. 6 is a wiring diagram of a generating circuit for generating signals representative of the illuminance of the photodiode in one range of wavelengths, according to one embodiment.

The circuit PDA can be associated with a circuit used to determine whether the wavelength of an incident photon belongs to one or more ranges of wavelengths. Thus, FIG. 6 represents a generating circuit PDT for generating signals representative of the illuminance of the photodiode in one range of wavelengths, according to one embodiment. In FIG. 6, the signal DS is supplied to a direct input of two comparators CP1, CP2 each receiving at an inverting input a respective threshold voltage V1, V2. The output of the comparator CP1 is linked through an inverter I1 to a clock signal input of a counter CN1. The output of the comparator CP2 is connected to a clock signal input of a D-type flip-flop FF1 including a direct output Q connected to a direct input of a NOR-type logic gate OG1. The D input of the flip-flop FF1 receives the supply voltage Vcc from the circuit PDT. The output of the inverter I1 is also connected to a reset control input for resetting the flip-flop FF1. The gate output OG1 is connected to a counting input of the counter CN1. An integration control signal INT is supplied to an inverted input of the gate OG1. A reset control signal RST is supplied to a reset input of the counter CN1. The output of the counter CN1 supplies a numerical counting value, for example on 8 or 16 bits, representative of the number of pulses detected by the comparator CP1, but not by the comparator CP2.

The threshold voltages V1, V2 are selected so as to match threshold wavelengths λS1 and λS2 ranging between the minimum λm and maximum λM wavelengths. In FIGS. 5A and 5B, the voltages V1 and V2 thus delimit a range of wavelengths [λS2, λS1] of photons to which the photodiode PD is sensitive. Therefore, the circuit PDT supplies a numerical value representative of the number of photons having a wavelength in the range of wavelengths [λS2, λS1] that have entered the photodiode PD. It shall be noted that the threshold voltage V1 can be selected equal to Rg·k·e so as to match the maximum wavelength λM of the photons to be detected. The voltage V1 can also be adjusted so as to avoid noise.

Figure 7A:
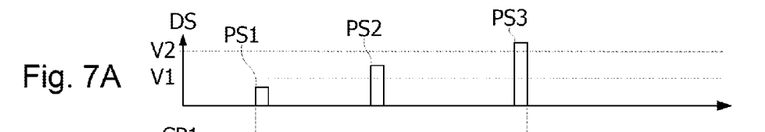
FIGS. 7A to 7H represent timing diagrams of signals appearing in the circuit in FIG. 6.
Figure 7B:
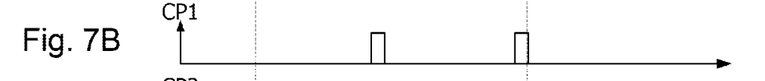
Figure 7C:
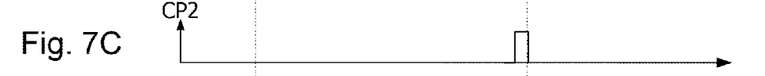
Figure 7D:
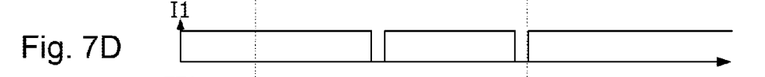
Figure 7E:
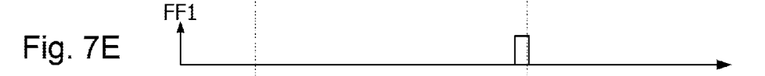
Figure 7F:
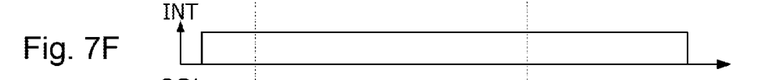
Figure 7G:
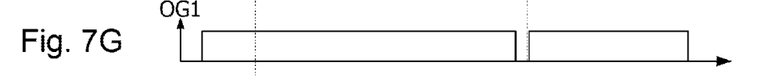
Figure 7H:
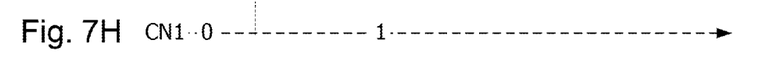

FIGS. 7A to 7H show the operation of the circuit PDT. FIG. 7A is a timing diagram of the signal DS. FIGS. 7B, 7C, 7D and 7E are timing diagrams of the output signals of the comparators CP1, CP2 of the inverter I1 and flip-flop FF1. FIGS. 7F and 7G are timing diagrams of the signal INT and of the output signal of the gate OG1. FIG. 7H indicates the changes in the value of the counter CN1 over time in connection with the timing diagrams in FIGS. 7A to 7G. The timing diagram of the signal DS (FIG. 7A) includes a first pulse PS1 the amplitude of which is below the threshold voltage V1. This pulse does not cause any change of state of the outputs of the comparators CP1 and CP2 which remain on 0. The output of the flip-flop FF1 thus remains on 0, and the output of the inverter I1 remains on 1. During an acquisition period for the acquisition of the signal coming from the photodiode (signal INT on 1), the output of the gate OG1 is on 1. The counter CN1 is not incremented and remains on 0 in the absence of any counting pulse supplied by the inverter I1. It shall be noted that while the signal INT is on 0, the output of the gate OG1 remains on 0. Therefore, the counter CN1 cannot be incremented.

The timing diagram of the signal DS then includes a second pulse PS2 the amplitude of which is above the threshold voltage V1, but below the voltage V2. The output of the comparator CP1 supplies a pulse and the output of the comparator CP2 remains on 0. The output of the inverter I1 thus also supplies a reverse pulse the falling edge of which triggers a counting operation by the counter CN1. In parallel, as the output of the comparator CP2 has remained on 0, the state of the flip-flop FF1 does not change and the output of the gate OG1 remains on 1. The counter CN1 is thus incremented by 1 during the counting operation. The rising edge of the output signal of the inverter I1 then resets the state of the flip-flop FF1 which remains on 0.

The timing diagram of the signal DS then includes a third pulse PS3 the amplitude of which is above the threshold voltages V1 and V2. The output of each comparator CP1, CP2 thus supplies a pulse, and the output of the inverter I1 also supplies a reverse pulse the falling edge of which triggers a counting operation by the counter CN1. The pulse at the output of the comparator CP2 causes a change to the state of the flip-flop FF1. The output of the gate OG1 thus changes to 0 and does not trigger any increment of the counter CN1 which remains on 1 during the counting operation. At the end of the pulse PS3, the rising edge of the output signal of the inverter I1 then triggers the reset of the flip-flop FF1 which changes back to 0, and the output signal of the gate OG1 changes back to 1.

The result is that the counter CN1 is incremented by 1 when a pulse appears in the signal DS only when the amplitude of that pulse is between the voltages V1 and V2, and during the acquisition period for the acquisition of the signal of the photodiode (signal INT on 1). At the end of each acquisition period, the counter CN1 thus supplies a value representative of the number of photons having reached the photodiode PD during the acquisition period and having a wavelength in a wavelength range delimited by threshold wavelengths λS1 and λS2 corresponding to the threshold voltages V1 and V2. When the signal INT changes to 0, the counter CN1, once read, can be set to 0 using the signal RST, to enable a new acquisition of the signal of the photodiode.

If the photodiode PD is one pixel of an image sensor including a matrix of pixels, each bit of the Q output of the counter CN1 can be linked to a line of a parallel output bus N1 of the image sensor through a selection transistor ST, for example of n-channel CMOS type. All the transistors ST linked to a Q output bit of the counter CN1 are controlled by a same pixel selection signal SEL. When the transistors ST are put on during a pulse supplied by the signal SEL, the value of the counter CN1 is transferred onto the bus N1.

It shall be noted that, by inverting the output signal of the flip-flop FF1 before supplying the gate OG1 with it, the circuit PDT can enable the photons received by the photodiode PD and having a wavelength lower than the wavelength λS2 to be counted. The voltages V1 and V2 can also be changed over time to adjust the range of wavelengths of the photons to be detected. Therefore, the circuit PDT can be used to successively and alternately perform a detection of photons in several ranges of wavelengths.

Figure 8:
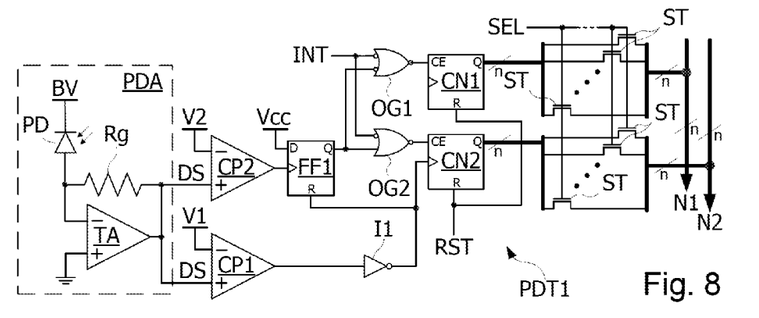
FIG. 8 is a wiring diagram of a generating circuit for generating signals representative of the illuminance of the photodiode in two ranges of wavelengths, according to one embodiment.

FIG. 8 represents a generating circuit PDT1 for generating signals representative of the illuminance of the photodiode PD in each of two ranges of wavelengths, according to one embodiment. The circuit PDT1 differs from the circuit PDT in that it includes two NOR-type logic gates OG1, OG2, and two counters CN1, CN2. The Q output of the flip-flop FF1 is connected to an inverted input of the gate OG1 and to a direct input of the gate OG2. The signal INT is supplied to an inverted input of the gates OG1 and OG2. The output of the gate OG1 is connected to a counting input of the counter CN1 and the output of the gate OG2 is connected to a counting input of the counter CN2. The reset signal RST is connected to a reset control input for resetting the counters CN1, CN2.

In this way, the pulses of the signal DS supplied by the circuit PDA after the photodiode PD has received a photon, are compared with the threshold voltages V1 and V2. The pulses above the threshold voltage V1 and below the threshold voltage V2 increment the counter CN1 and the pulses above the threshold voltage V2 increment the counter CN2.

If the photodiode PD is one pixel of an image sensor including a matrix of pixels, the bits of the Q output of each counter CN1, CN2 can be linked to a respective line of a parallel output bus N1, N2 of the image sensor, through selection transistors ST the gate of which is controlled by a single pixel selection signal SEL. Therefore, by putting the signal SEL to its active state, the values of the counters CN1, CN2 can be transferred onto the buses N1, N2. After reading the values of the counters CN1, CN2, the counters can be put back to 0 by a pulse supplied by the reset signal RST.

Figure 9:
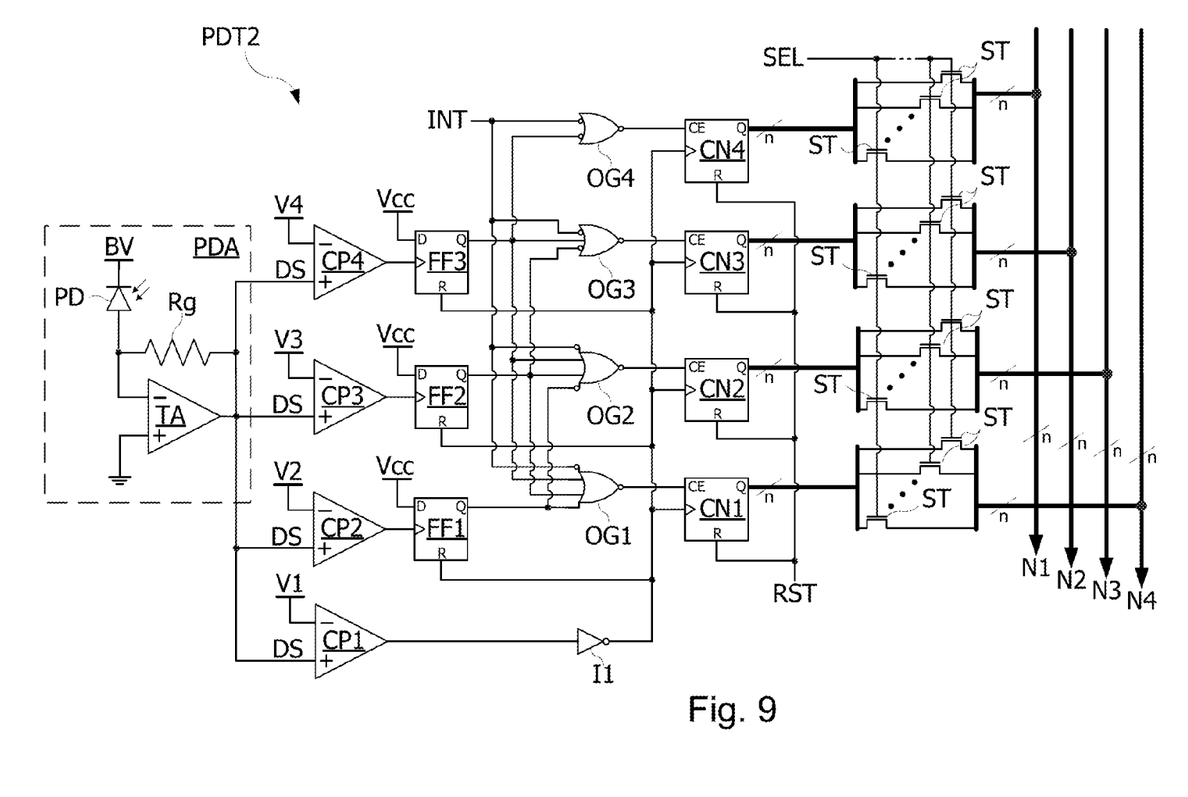
FIG. 9 is a wiring diagram of a generating circuit for generating signals representative of the illuminance of the photodiode in four ranges of wavelengths, according to one embodiment.

FIG. 9 represents a generating circuit PDT2 for generating signals representative of the illuminance of the photodiode in four ranges of wavelengths, according to one embodiment. The circuit PDT2 differs from the circuit PDT in that it includes two additional comparators CP3, CP4 to compare the signal DS with two additional threshold voltages V3, V4, such that V1<V2<V3<V4. The voltage V3 delimits with the voltage V2 a second range of wavelengths and with the voltage V4 a third range of wavelengths. The voltage V4 delimits a fourth range of wavelengths located beyond the wavelength corresponding to this voltage. The circuit PDT2 also includes two additional D-type flip-flops FF2, FF3, three additional logic gates OG2, OG3, OG4, and three additional counters CN2, CN3, CN4. The output of the inverter I1 is connected to a clock signal input of the counters CN1 to CN4. The integration signal INT is supplied to an inverted input of each of the gates OG1 to OG4. The D input of the flip-flops FF1 to FF3 receives the supply voltage Vcc from the circuit PDT2. The Q output of the flip-flop FF1 is connected to a direct input of the gate OG1 and to an inverted input of the gate OG2. The output of the comparator CP3 is connected to a clock signal input of the flip-flop FF2. The Q output of the flip-flop FF2 is connected to a direct input of the gates OG1 and OG2 and to an inverted input of the gate OG3. The output of the comparator CP4 is connected to a clock signal input of the flip-flop FF3. The Q output of the flip-flop FF3 is connected to a direct input of the gates OG1, OG2 and OG3 and to an inverted input of the gate OG4. The output of each gate OG1 to OG4 is connected to a counting input of one of the counters CN1 to CN4.

Therefore, the counter CN1 is incremented by 1 during an acquisition period (signal INT on 1) when the photodiode PD receives a photon the wavelength of which is between two wavelengths corresponding respectively to the voltages V1 and V2. The counter CN2 is incremented by 1 during the acquisition period when the photodiode PD receives a photon the wavelength of which is between two wavelengths corresponding respectively to the voltages V2 and V3. The counter CN3 is incremented by 1 during the acquisition period when the photodiode PD receives a photon the wavelength of which is between two wavelengths corresponding respectively to the voltages V3 and V4. The counter CN4 is incremented by 1 during the acquisition period when the photodiode PD receives a photon the wavelength of which is smaller than the wavelength corresponding to the voltage V4. It shall be noted that if it is not desirable to detect photons with a wavelength smaller than the wavelength corresponding to the voltage V4, the gate OG4 and the counter CN4 can be omitted.

If the photodiode PD is one pixel of an image sensor including a matrix of pixels, each bit of the Q output of each counter CN1 to CN4 can be linked to a line of an output bus N1, N2, N3, N4 of the image sensor through a selection transistor ST. All the transistors ST linked to a Q output bit of one of the counters CN1 to CN4 are controlled by a same pixel selection signal SEL. Therefore, by putting the signal SEL to its active state, the values of the counters CN1 to CN4 can be transferred onto the buses N1 to N4. After reading the values of the counters CN1 to CN4, the counters can be put back to 0 by a pulse supplied by the reset signal RST.

The circuit PDT2 thus enables, with a single photodiode, several signals to be supplied that are representative of photons received by a single photodiode respectively in several ranges of wavelengths.

It shall be noted that more ranges of wavelengths can thus be discriminated by providing other comparators to compare the signal DS with other threshold voltages corresponding to other limits of wavelength ranges. It can also be provided that the ranges of wavelengths discriminated by the comparators partially overlap, by adjusting the threshold voltages V1 to V4 so as to form voltage ranges which partially overlap. It can also be provided to reject one or more ranges of wavelengths, for example by removing one of the gates OG1 to OG4 and the counter CN1 to CN4 connected to the removed gate, so as not to perform any counting of the output pulse of the amplifier TA when the amplitude of this pulse is between two of the voltages V1 to V4.

It will be understood by those skilled in the art that various alternative embodiments and various applications of the present invention are possible. In particular, the present invention is not limited to the use of a photodiode not having any collection layer. It is merely important that the avalanche layer of the photodiode can be compatible with the range of wavelengths of photons to be detected. Provided that this condition can be met, this invention can also be applied to all wavelength bands.

The circuits in FIGS. 6, 8 and 9 perform a conversion of the pulses of current coming from the photodiode into pulses of voltage and a comparison of the pulses of voltage with voltage thresholds. Naturally, these circuits can easily be modified to amplify the pulses of current and compare these amplified pulses of current with current thresholds.

Thanks to its ability to discriminate narrow wavelength bands, the detection device that has just been described can be advantageously used in many applications. Thus, in astronomy, the detection device can supply images simultaneously in different spectral bands. On the contrary, present-day devices can only perform such observations sequentially in different spectral bands. The detection device can also apply to hyperspectral vision. Indeed, the detection device proves particularly adapted to simultaneous vision in several narrow and contiguous bands. The detection device can also serve as a pre-disperser in a cross-dispersion spectroscope to sort orders from a network or an interferometer. In the biomedical field and in particular in fluorescence and bioluminescence imaging, the device can discriminate the excitation photons, the fluorescent photons, and the bioluminescent markers, provided that they have different wavelengths. The detection device can also be used in the infrared range to determine the absolute temperature of a body observed, by detecting photons simultaneously in two or more spectral bands. The detection device is also particularly suited to DWDM (Dense Wavelength Division Multiplexing) communications consisting in transmitting in an optical fiber several laser communications at different wavelengths. The detection device can also be used in particle physics to determine the energy (i.e. the wavelength) of photons.

Moreover, the simplicity and thus the speed of logic circuits used to process the detected signals makes the detection device particularly adapted to determining in a highly accurate manner the flight time of a photon in a LADAR (laser radar) system when the detection is synchronized with a pulsed laser, or in a positron emission tomography system.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A method for detecting photons, comprising:
   subjecting a semi-conductive material of a photodiode to a bias voltage such that an avalanche phenomenon is triggered in an avalanche layer of the semi-conductive material when a photon reaches the avalanche layer, wherein the avalanche layer extends between minimum and maximum depths into the semi-conductive material from a surface thereof so that the avalanche layer can be reached by a photon having a wavelength ranging between minimum and maximum wavelengths,
   the method further comprising:
   generating, by the photodiode, a signal having an amplitude depending on a depth reached by a photon within the avalanche layer, the signal being generated with a gain that varies as a function of a wavelength of the photon received by the photodiode,
   comparing, by a measuring circuit connected to the photodiode, the amplitude of the signal generated by the photodiode with two different threshold values, and
   deducing, by the measuring circuit, that the photon received by the photodiode has a wavelength between two threshold wavelengths ranging between the minimum and maximum wavelengths, if the amplitude of the signal is between the two threshold values.

2. The method according to claim 1, further comprising counting, during an acquisition period, a number of pulses detected at terminals of the photodiode, having an amplitude between the two threshold values to obtain a value representative of a number of photons that have entered the photodiode during the acquisition period, and having a wavelength between the two threshold wavelengths.

3. The method according to claim 1, further comprising counting, during an acquisition period, a number of pulses detected at terminals of the photodiode, having an amplitude greater than the highest of the two threshold values to obtain a value representative of a number of photons that have entered the photodiode during the acquisition period, and having a wavelength below the lowest of the two threshold wavelengths.

4. The method according to claim 1, wherein the lowest of the two threshold values-corresponds to an extreme photon wavelength to be detected.

5. The method according to claim 1, further comprising:
   comparing the amplitude of the signal supplied by the photodiode with several other threshold values, the two threshold values delimiting several ranges of amplitude values, and
   counting during an acquisition period numbers of pulses of the signal in each of the ranges of amplitude values.

6. The method according to claim 5, wherein ranges of pulse amplitude values delimited by the threshold values are not contiguous and/or overlap.

7. The method according to claim 1, further comprising adjusting the threshold values to adjust ranges of wavelengths in which photons are to be detected.

8. The method according to claim 1, further comprising adjusting the bias voltage of the photodiode to change a thickness of the avalanche layer so that all the photons to be detected can reach the avalanche layer without going beyond the avalanche layer.

9. A device for detecting photons, comprising
   a photodiode formed in a semi-conductive material,
   a bias circuit connected to the photodiode and configured to subject the semi-conductive material to a bias voltage such that an avalanche phenomenon is triggered in an avalanche layer of the semi-conductive material when a photon reaches the avalanche layer, wherein the avalanche layer extends between minimum and maximum depths into the semi-conductive material from a surface thereof so that the avalanche layer can be reached by photons having a wavelength between minimum and maximum wavelengths, and wherein the photodiode generates a signal having an amplitude depending on a depth reached by a photon within the avalanche layer, the signal being generated with a gain that varies as a function of a wavelength of the photon received by the photodiode, and a measurement circuit connected to the photodiode and configured to compare the amplitude of the signal generated by the photodiode with two different threshold values, and to deduce that the photon received by the photodiode has a wavelength between two threshold wavelengths ranging between the minimum and maximum wavelengths, if an amplitude of the signal is between the two threshold values.

10. The device according to claim 9, wherein the photodiode comprises a low-doped or undoped collection layer with a reduced thickness so that the avalanche layer can extend at least down to a depth reached by photons having an extreme wavelength to be detected.

11. The device according to claim 9, wherein the photodiode comprises a pn junction-made at a certain depth in the semi-conductive material, the semi-conductive material and the depth of the pn junction being chosen so that the semi-conductive material can be passed through by photons to be detected down to a depth likely to be located in the avalanche layer of the photodiode.

12. The device according to claim 9, wherein the measurement circuit is further configured to count, during an acquisition period, a number of pulses detected at terminals of the photodiode, having an amplitude between the two threshold values to obtain a value representative of a number of photons that have entered the photodiode during the acquisition period, and having a wavelength between the two threshold wavelengths.

13. The device according to claim 9, wherein the measurement circuit is further configured to count, during an acquisition period, a number of pulses detected at terminals of the photodiode, having an amplitude greater than the highest of the two threshold values to obtain a value representative of a number of photons that have entered the photodiode during the acquisition period, and having a wavelength below the lowest of the two threshold wavelengths.

14. The device according to claim 9, wherein the lowest of the two threshold values corresponds to an extreme photon wavelength to be detected.

15. The device according to claim 9, wherein the measurement circuit is further configured to:
compare the amplitude of the signal supplied by the photodiode with several other threshold values, the threshold values delimiting several ranges of amplitude values, and
count, during an acquisition period, numbers of pulses of the signal in each of the ranges of amplitude values.

16. The device according to claim 15, wherein ranges of pulse amplitude values delimited by the threshold values are not contiguous and/or overlap.

17. The device according to claim 9, further configured to adjust the threshold values to adjust ranges of wavelengths in which photons are to be detected.

18. The device according to claim 9, further configured to adjust the bias voltage of the photodiode so that all the photons to be detected can reach the avalanche layer without going beyond the avalanche layer.

19. An imager, comprising several detection devices, each comprising:
a photodiode formed in a semi-conductive material,
a bias circuit connected to the photodiode and configured to subject the semi-conductive material to a bias voltage such that an avalanche phenomenon is triggered in an avalanche layer of the semi-conductive material when a photon reaches the avalanche layer, wherein the avalanche layer extends between minimum and maximum depths into the semi-conductive material from a surface thereof so that the avalanche layer can be reached by photons having a wavelength between minimum and maximum wavelengths, and wherein the photodiode generates a signal having an amplitude depending on a depth reached by a photon within the avalanche layer, the signal being generated with a gain that varies as a function of a wavelength of the photon received by the photodiode, and
a measurement circuit connected to the photodiode and configured to compare the amplitude of the signal supplied by the photodiode with two different threshold values, and to deduce that the photon received by the photodiode has a wavelength between two threshold wavelengths ranging between the minimum and maximum wavelengths, if an amplitude of the signal is between the two threshold values,
wherein the photodiodes of the detection devices are disposed according to a matrix configuration.

20. The imager according to claim 19, wherein each photodiode comprises a low-doped or undoped collection layer with a reduced thickness so that the avalanche layer can extend at least down to a depth reached by photons having an extreme wavelength to be detected.

21. The imager according to claim 19, wherein each photodiode comprises a pn junction made at a certain depth in the semi-conductive material, the semi-conductive material and the depth of the pn junction being chosen so that the semi-conductive material can be passed through by photons to be detected down to a depth likely to be located in the avalanche layer of the photodiode.

22. The imager according to claim 19, wherein each measurement circuit is further configured to count, during an acquisition period, a number of pulses detected at terminals of the photodiode, having an amplitude between the two threshold values to obtain a value representative of a number of photons that have entered the photodiode during the acquisition period, and having a wavelength between the two threshold wavelengths.

23. The imager according to claim 19, wherein each measurement circuit is further configured to count, during an acquisition period, a number of pulses detected at terminals of the photodiode, having an amplitude greater than the highest of the two threshold values to obtain a value representative of a number of photons that have entered the photodiode during the acquisition period, and having a wavelength below the lowest of the two threshold wavelengths.

24. The imager according to claim 19, wherein the lowest of the two threshold values corresponds to an extreme photon wavelength to be detected.

25. The imager according to claim 19, wherein each measurement circuit is further configured to:

compare the amplitude of the signal supplied by the photodiode with several other threshold values, the threshold values delimiting several ranges of amplitude values, and count during an acquisition period numbers of pulses of the signal in each of the ranges of amplitude values.

26. The imager according to claim 25, wherein ranges of pulse amplitude values delimited by the threshold values are not contiguous and/or overlap.

27. The imager according to claim 19, further configured to adjust the threshold values to adjust ranges of wavelengths in which photons are to be detected.

28. The imager according to claim 19, further configured to adjust the bias voltage of each photodiode so that all the photons to be detected can reach the avalanche layer of each photodiode without going beyond the avalanche layer.

* * * * *